(12) United States Patent
Tanaka

(10) Patent No.: US 8,138,594 B2
(45) Date of Patent: Mar. 20, 2012

(54) SEMICONDUCTOR DEVICE AND MANUFACTURING METHOD OF A SEMICONDUCTOR DEVICE

(75) Inventor: Shinji Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 105 days.

(21) Appl. No.: 12/551,888

(22) Filed: Sep. 1, 2009

(65) Prior Publication Data

US 2010/0072601 A1 Mar. 25, 2010

(30) Foreign Application Priority Data

Sep. 22, 2008 (JP) .................................. 2008-242707

(51) Int. Cl.
*H01L 25/11* (2006.01)
(52) U.S. Cl. .. 257/686; 257/723; 257/777; 257/E21.512
(58) Field of Classification Search .................. 257/686, 257/777, E21.512, E21.705, 685, 723, 728
See application file for complete search history.

(56) References Cited

U.S. PATENT DOCUMENTS

| | | | | |
|---|---|---|---|---|
| 5,094,978 A | * | 3/1992 | Miyagaki et al. | 438/609 |
| 5,869,894 A | * | 2/1999 | Degani et al. | 257/723 |
| 7,224,058 B2 | * | 5/2007 | Fernandez | 257/707 |

FOREIGN PATENT DOCUMENTS

JP 2002083925 A 3/2002

* cited by examiner

*Primary Examiner* — Roy Potter

(57) ABSTRACT

A semiconductor device of the present invention comprises a substrate and a first semiconductor element. The substrate comprises an inner layer conductor and a cavity comprising the bottom surface on which a part of the inner layer conductor is exposed. The first semiconductor element contacts, in the cavity, the inner layer conductor directly or via a good heat conductor material.

7 Claims, 12 Drawing Sheets

SEMICONDUCTOR ELEMENT(LSI CHIP) 4

SEMICONDUCTOR DEVICE AND MANUFACTURING METHOD OF A SEMICONDUCTOR DEVICE

This application is based upon and claims the benefit of priority from Japanese Patent Application No. 2008-242707, filed on Sep. 22, 2009, the disclosure of which is incorporated herein in its entirety by reference.

TECHNICAL FIELD

The present invention relates to a semiconductor device, and more particularly, to a semiconductor device which is small in size and excellent in heat radiation characteristics.

BACKGROUND ART

As a method for mounting two semiconductor elements (hereinafter, referred to as "IC chips") on a substrate, a structure in which both of the two IC chips are connected electrically via bumps, etc., has been adopted. Hereinafter, this structure is called "a chip-on-chip structure." By adopting such a structure, it is possible to make the size of the substrate small in comparison with a case where each IC chip is mounted separately.

However, in a semiconductor device of chip-on-chip structure, there is a problem that the thickness becomes large, because it has a construction in which IC chips 151 and 152 are simply stacked on a substrate 153 as shown in FIG. 15, for example.

Further, the wiring pattern (not illustrated) formed onto the substrate 153 needs to be connected with the IC chip 151 by a wire 154 made of metal or the like, because the surface of the IC chip 151 on which electrodes are provided does not face the substrate. As a result, when a high-frequency signal is handled in particular, there is also a problem that harmful effects caused by the inductance component of the wire 154 (such as poor sensitivity and varying sensitivity) cannot be ignored.

On the other hand, in Japanese Patent Application Laid-open Publication No. 2002-83925, an integrated circuit device is disclosed as shown in FIG. 16. In the integrated circuit device, a first IC chip 161 and a second IC chip 162 are connected electrically via bumps 163, and a recess 165 enough to accommodate the second IC chip 162 is formed on a surface of a substrate 164. And the first IC chip 161 and the substrate 164 are connected electrically at a position where the second IC chip 162 is situated in the recess 165. In this integrated circuit device, the second IC chip 162 is located inside the recess, and the first IC chip 161 and the substrate 164 are connected without a wire. As a result, thinning can be achieved and the harmful influence by an inductance component which occurs in case of a circuit which handles a high-frequency signal can be reduced.

However, in the integrated circuit device in the above-mentioned Japanese Patent Application, heat tends to be accumulated around the first IC chip 161, and there is a problem that the heat radiation characteristics is not good.

SUMMARY

An exemplary object of the invention is to provide a semiconductor device in which miniaturization is realized, negative effect of an inductance component when handling a high-frequency signal is mitigated, and also heat radiation characteristics is improved.

BRIEF DESCRIPTION OF THE DRAWINGS

Exemplary features and advantages of the present invention will become apparent from the following detailed description when taken with the accompanying drawings in which.

EXEMPLARY EMBODIMENT

Next, a first exemplary embodiment of the semiconductor device of the present invention will be described.

Figure 1:
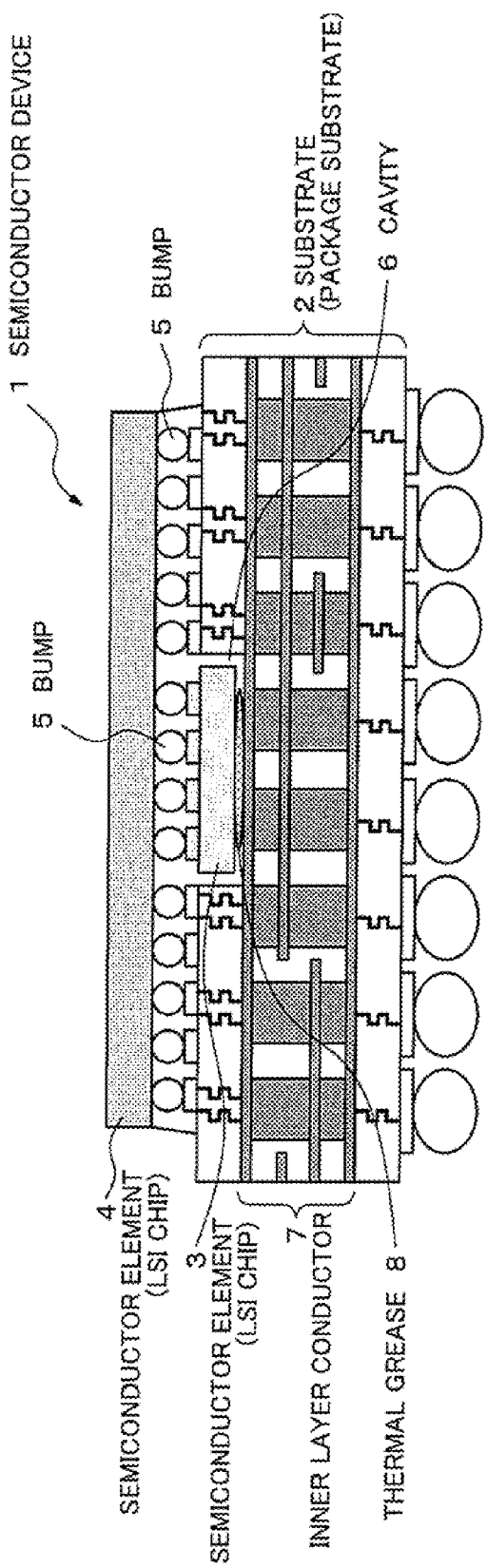
FIG. 1 is a sectional view of a semiconductor device 1 of a first embodiment of the present invention.

FIG. 1 is a sectional view of the semiconductor device 1 according to this embodiment.

The semiconductor device 1 includes a substrate 2 (hereinafter, referred to as "a package substrate"), a semiconductor element 3 (hereinafter, referred to as "an LSI chip 3") and a semiconductor element 4 (hereinafter, referred to as "an LSI chip 4").

A cavity 6 enough to accommodate the LSI chips is formed into the package substrate 2 (In this case, the LSI chip 3 is smaller than the package substrate 2). On the bottom face of the cavity 6, an inner layer conductor 7 of the package substrate 2 is exposed.

The LSI chip 3 is mounted in a face-up manner and is connected with the LSI chip 4 via bumps 5 which are made of gold or the like. Wiring is drawn out from the bumps 5, and the LSI chip 3 is connected with the LSI chip 4 electrically via the wiring. Thermal grease 8 lies between the LSI chip 3 and the inner layer conductor 7 and the LSI chip 3 contacts the inner layer conductor 7 via the thermal grease 8.

The LSI chip 4 is mounted in a face-down manner and connected with the package substrate 2 at a position where the LSI chip 3 can be accommodated in the cavity 6. The LSI chip 3 is connected with the wiring formed on the package substrate 2 electrically via the bumps 5 without a wire.

According to the embodiment, there are effects that the miniaturization of a semiconductor device can be achieved and the harmful influence of an inductance component can be reduced. Also, there is another effect that it is possible to improve the heat radiation characteristics by the LSI chip 3 contacting the inner layer conductor 7 of metal via the thermal grease 8.

A manufacturing method of the semiconductor device 1 will be described below using FIGS. 2 to 10. Here, although a build-up substrate is described as an example of a package substrate, it is not limited to this.

Figure 2:
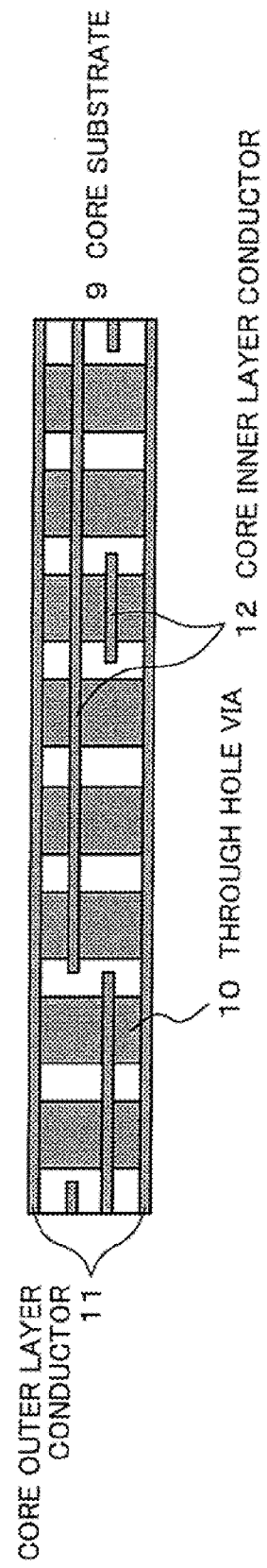
FIG. 2 is a diagram showing a production process of a build-up substrate 2.
Figure 3:
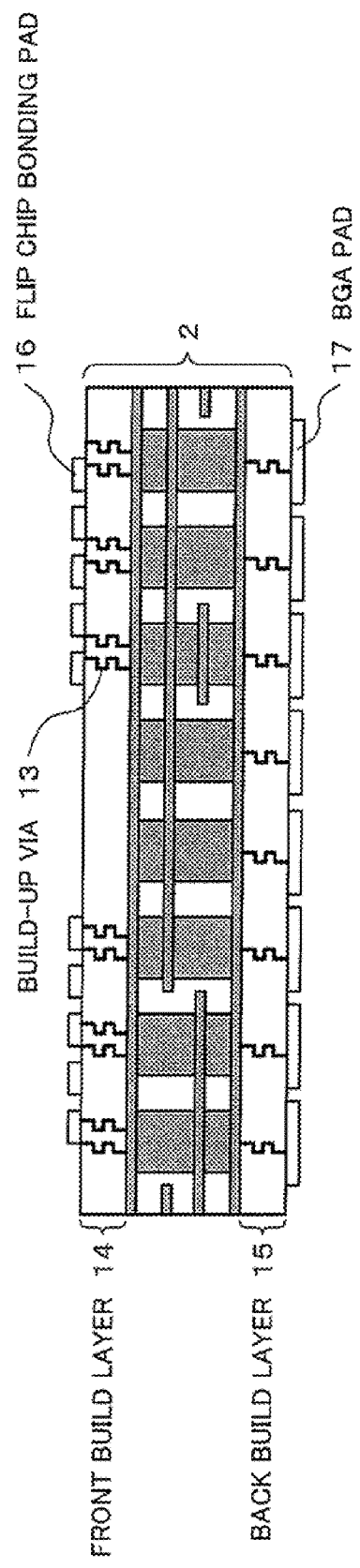
FIG. 3 is a diagram showing the production process (continuation of FIG. 2) of the build-up substrate 2.
Figure 4:
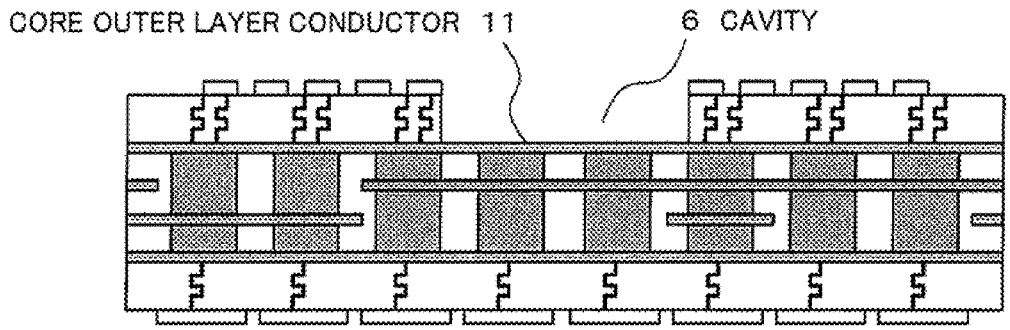
FIG. 4 is a diagram showing the production process (continuation of FIG. 3) of the build-up substrate 2.

[Step 1] Production Process of the Build-up Substrate 2 (FIGS. 2-4)

A manufacturing method of the build-up substrate 2 will be described.

First, in FIG. 1, a core substrate 9 is formed using a double-sided copper-clad core material and a prepreg. The core substrate 9 corresponds to the inner layer conductor 7 of FIG. 1. Next, by providing through hole vias 10 and performing outer layer circuit forming using a subtractive process which is common, a core outer layer conductor 11 is formed. The core substrate 9 also has a core inner layer conductor 12 in an inner layer.

Next, in FIG. 3, by forming build-up vias 13 and wiring on both sides of the core substrate 9, a build layer is formed. The build layer formed on the upper surface of the core substrate 9 is called a front build layer 14, and the build layer formed on the under surface of the core substrate 9 is called a back build layer 15.

Then, flip chip bonding pads 16 for mounting a LSI is provided on the outermost surface of the front build layer 14. Also, BGA pads 17 for placing BGA (Ball Grid Array) balls are provided on the outermost surface of the back build layer 15.

Next, in FIG. 4, the cavity 6 is scraped out using a routing machine. At this time, scraping in the depth direction is stopped at a time point when the core outer layer conductor 11 of the core substrate 9 is exposed. As disclosed in the above-mentioned Japanese Patent Application, the precision of the scraping process can be improved by detecting an electrical contact between a cutting drill and an exposed inner layer conductor. When the thickness of the LSI chip 3 is large, the processing may be continued until the core inner layer conductor 12 is exposed.

[Step 2] Mounting Process of the LSI chips 3 and 4 (FIGS. 5-8)

Figure 5:
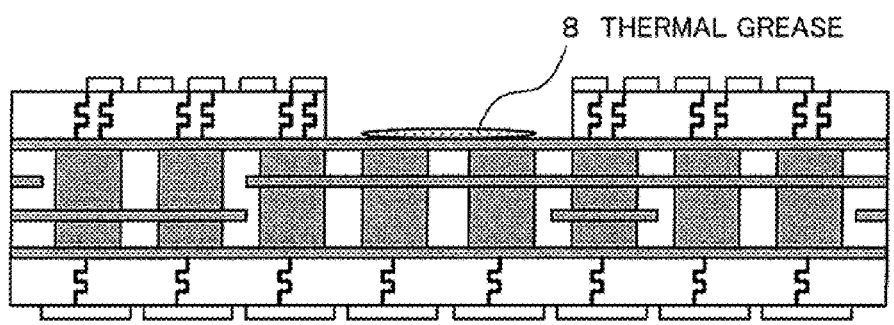
FIG. 5 is a diagram showing s mounting process of LSI chips 3 and 4.

First, in FIG. 5, a proper quantity of the thermal grease 8 is applied on the core outer layer conductor 11 in the cavity.

Figure 6:
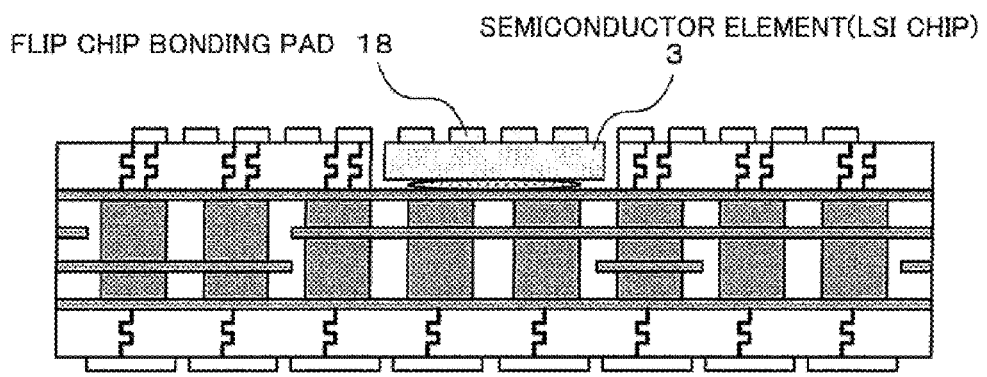
FIG. 6 is a diagram showing the mounting process (continuation of FIG. 5) of the LSI chips 3 and 4.

Next, in FIG. 6, the LSI chip 3 is mounted on the thermal grease 8 in a face-up manner. Flip chip bonding pads 18 formed in the same pitch as input terminals of the LSI chip 4 are provided on the circuit side of the LSI chip 3. The back of the LSI chip 3 is polished beforehand and the heights of the flip chip bonding pads 18 and the flip chip bonding pads 16 are adjusted so that they may become the same.

Figure 7:
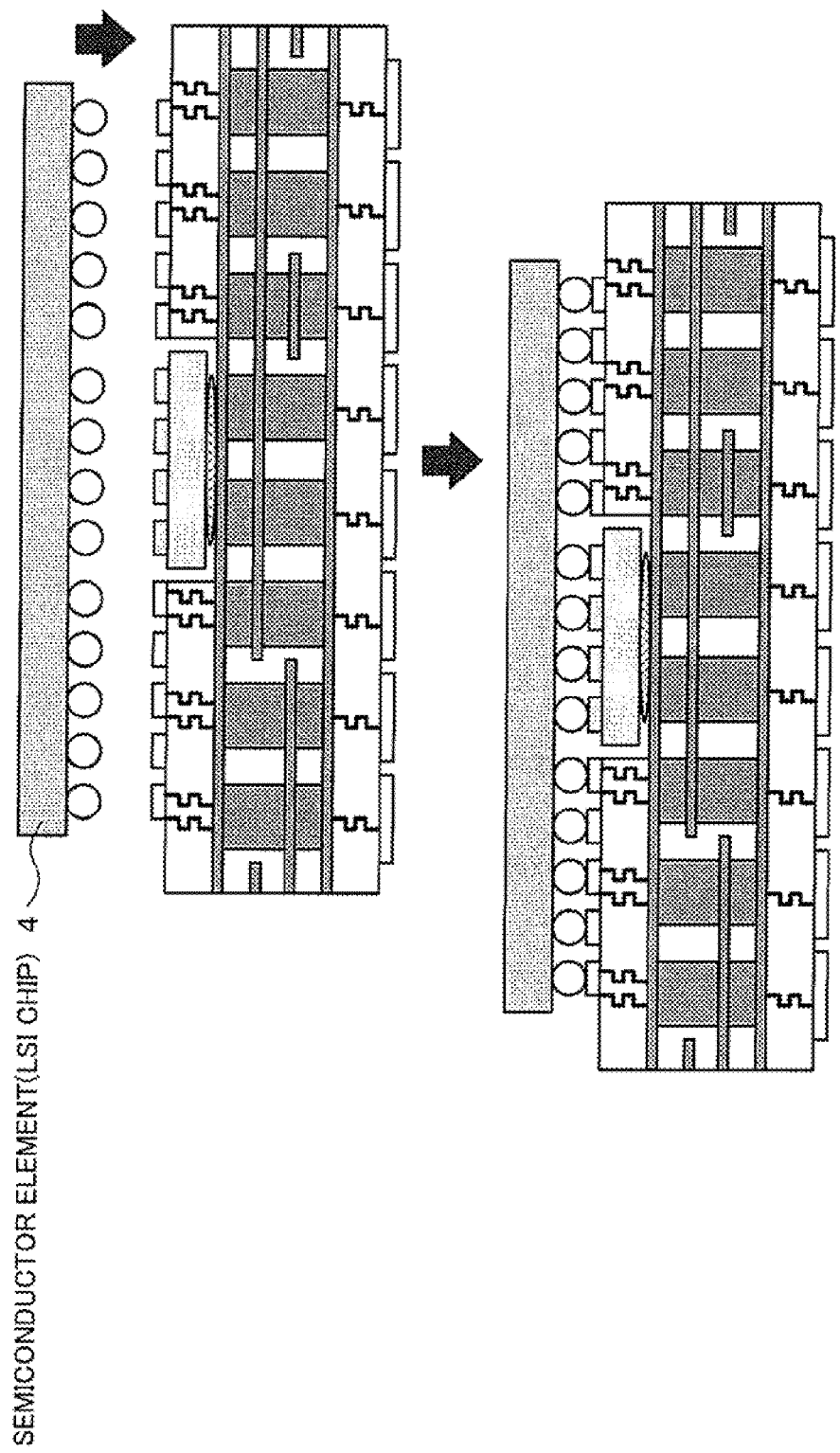
FIG. 7 is a diagram showing the mounting process Is (continuation of FIG. 6) of the LSI chips 3 and 4.

Next, in FIG. 7, solder paste is pre-coated on the flip chip bonding pads 16 of the build-up substrate 2 and the flip chip bonding pads 18 of the LSI chip 3 using a printing method. After that, flip-chip mounting is performed for the LSI chip 4 in a face-down manner.

Figure 8:
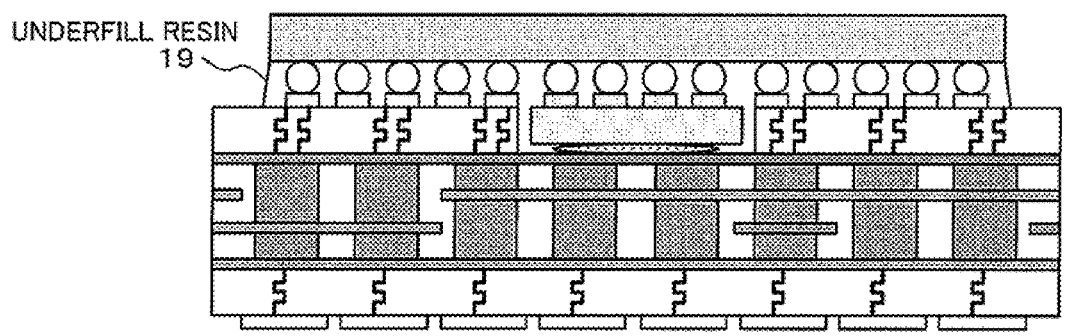
FIG. 8 is a diagram showing the mounting process (continuation of FIG. 7) of the LSI chips 3 and 4.

Next, in FIG. 8, underfill resin 19 is filled between the build-up substrate 2 and the LSI chip 4, also including the cavity 6.

Figure 9:
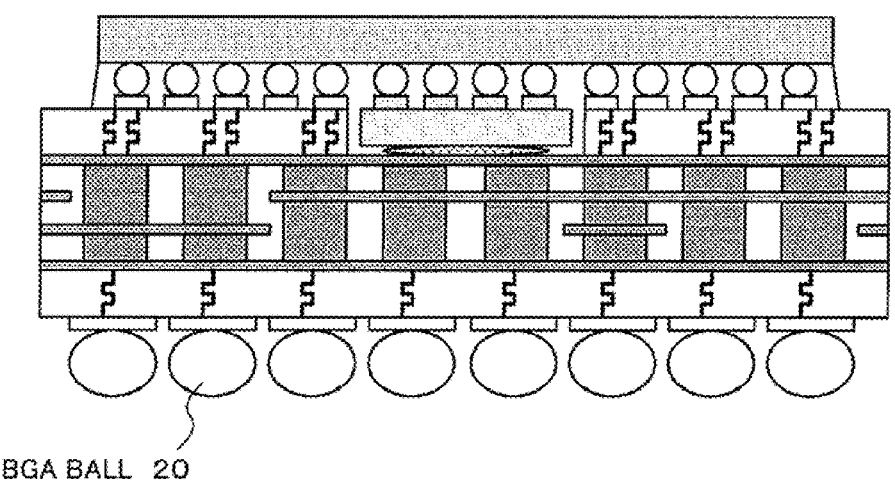
FIG. 9 a diagram showing a mounting process of BGA balls.

[Step 3] Mounting Process of BGA Balls (FIG. 9)

BGA balls 20 is mounted on the BGA pads 17 of the build-up substrate 2 (refer to FIG. 9).

By the above-mentioned steps, it is possible to produce a semiconductor device in which the harmful effect of an inductance component can be mitigated while realizing miniaturization, and which is capable of improving heat radiation characteristics.

Next, a second embodiment of the semiconductor device of the present invention will be described.

The semiconductor device in the second embodiment has a heat sink for improving heat radiation characteristics in addition to the structure of the first embodiment.

Figure 10:
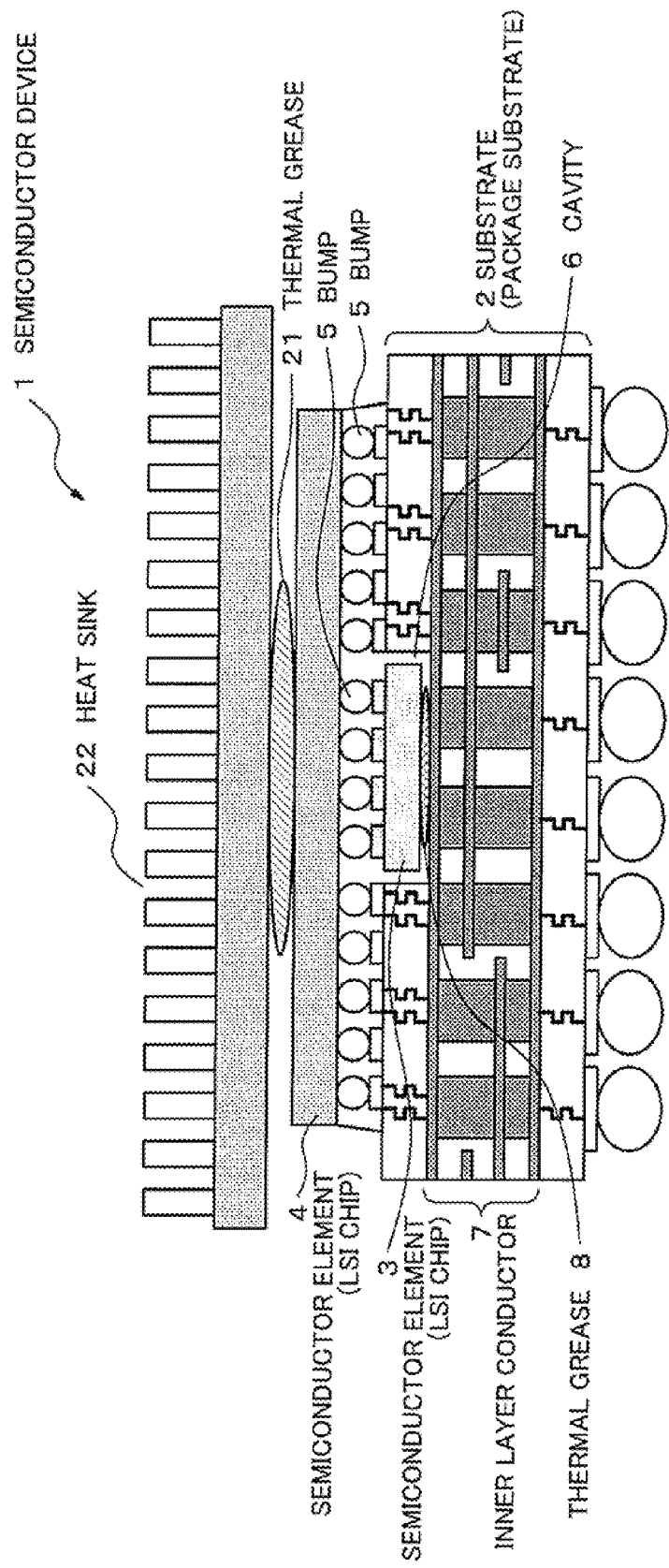
FIG. 10 is a sectional view of a semiconductor device 1 of a second embodiment of the present invention.

A sectional view of a semiconductor device 11 according to the second embodiment is shown in FIG. 10.

The second embodiment is different from the first embodiment only in the point that a heat sink 22 is attached on the upper surface of the LSI chip 4 via thermal grease 21.

As for the manufacturing method, only a step for applying a proper quantity of the thermal grease 22 on the back surface of the LSI chip 4 and mounting the heat sink 22 on it has to be added after Step 3 in the first embodiment (mounting process of BGA balls).

In the second embodiment, by providing a heat sink, heat radiation characteristics can be further improved.

Figure 11:
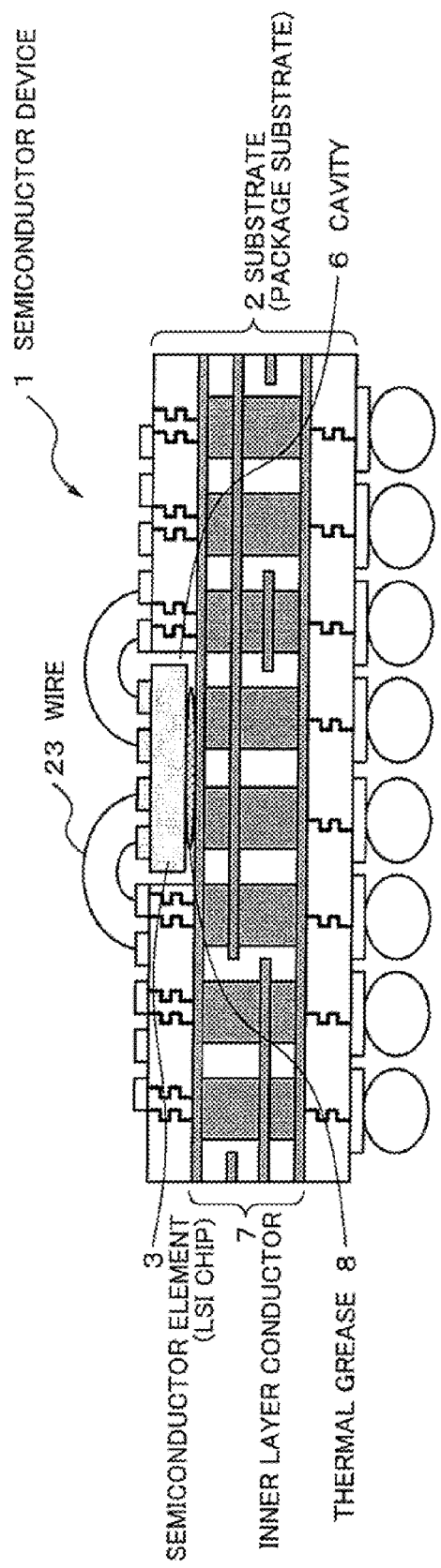
FIG. 11 is a sectional view showing a modification example of the semiconductor device 1 according to the first embodiment of the present invention.

Meanwhile, when the number of stacked LSI chips which is required is just one in the first embodiment, the device may be constructed such that the flip chip bonding pads 16 of the package substrate 2 and the flip chip bonding pads 18 of the LSI chip 3 are connected electrically via wires, as shown in FIG. 11. When it is desired to set the number of stacked LSI chips to no smaller than two, the construction may be such that a LSI chip having the flip chip bonding pads 18 on its upper and lower surfaces is stacked between the LSI chip 3 and the inner layer conductor 7.

Figure 12:
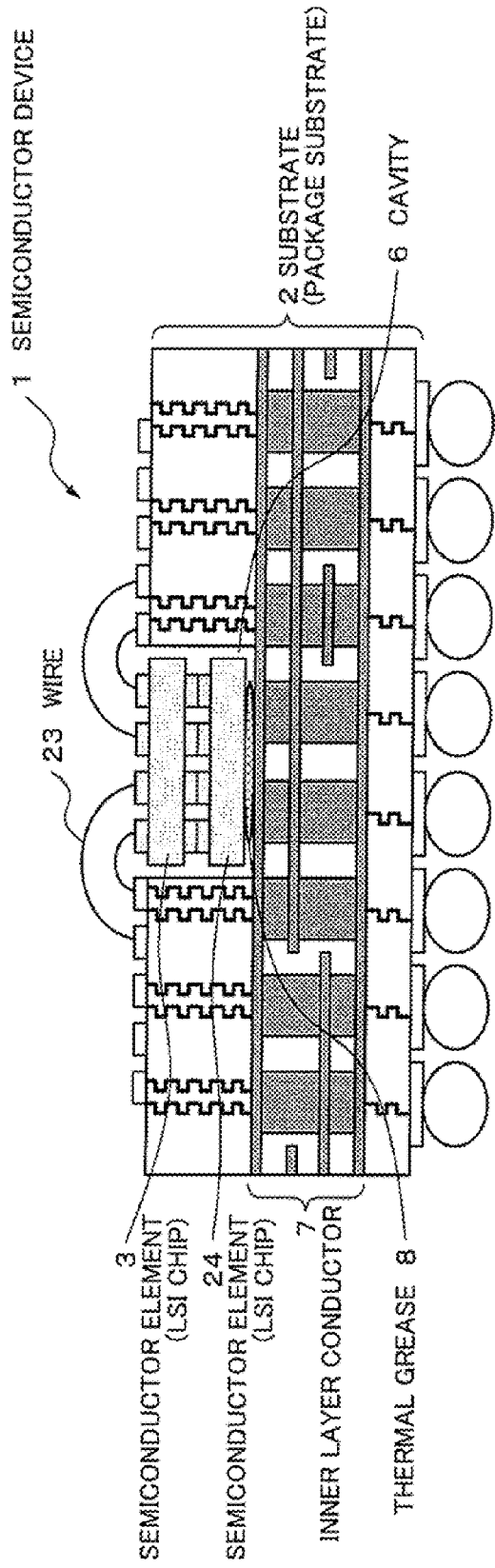
FIG. 12 is a sectional view showing a modification example of the semiconductor device 1.

In FIG. 12, an example in which one LSI chip (that is, a LSI chip 24) which has the flip chip bonding pads 18 on its upper and lower surfaces, is stacked between the LSI chip 3 and the inner layer conductor 7. (penetration silicon vias are provided in FIG. 12, but are not shown in FIG. 12)

Figure 13:
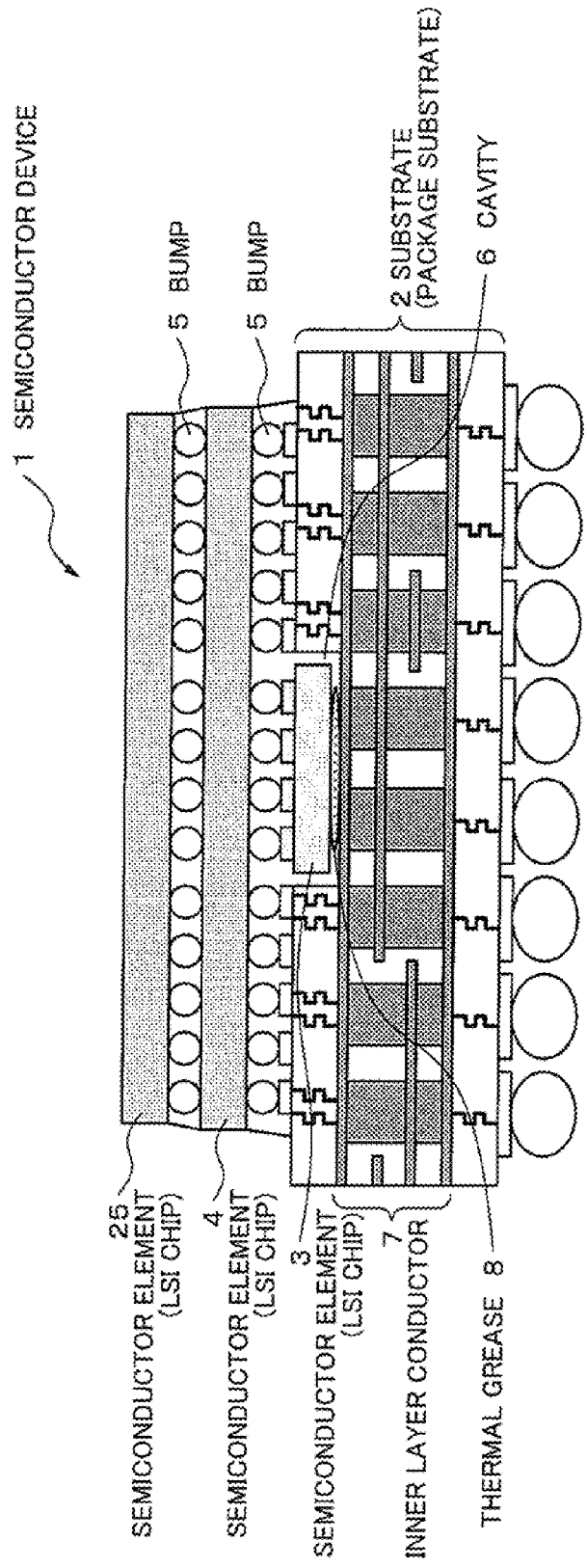
FIG. 13 is a sectional view showing a modification example of the semiconductor device 1 of the first and second embodiment of the present invention.

Further, in the first and second embodiments, when it is desired to set the number of the LSI chips to no smaller than three, the device may be constructed such that a plurality of cavities 6s are provided or additional LSI chips are stacked on the LSI chip 4. In FIG. 13, there is shown an example where one LSI chip 25 is stacked on the LSI chip 4. In this case, a penetration silicon via is provided in the LSI chip 4, although not shown.

Figure 14:
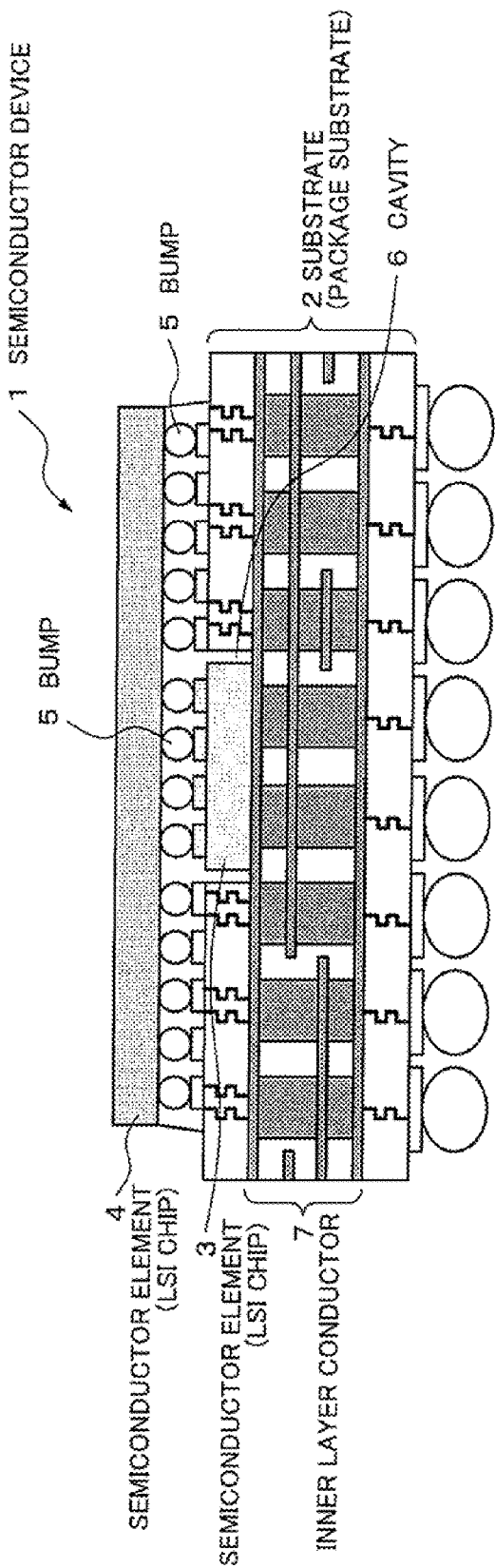
FIG. 14 is a diagram showing a modification example of the semiconductor device 1.
Figure 15:
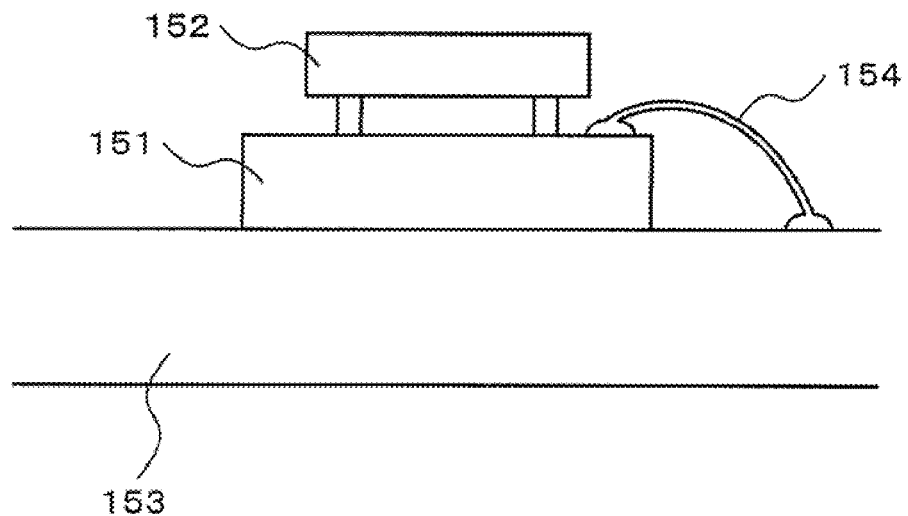
FIG. 15 is a diagram showing a semiconductor device having some relation with the present invention.
Figure 16:
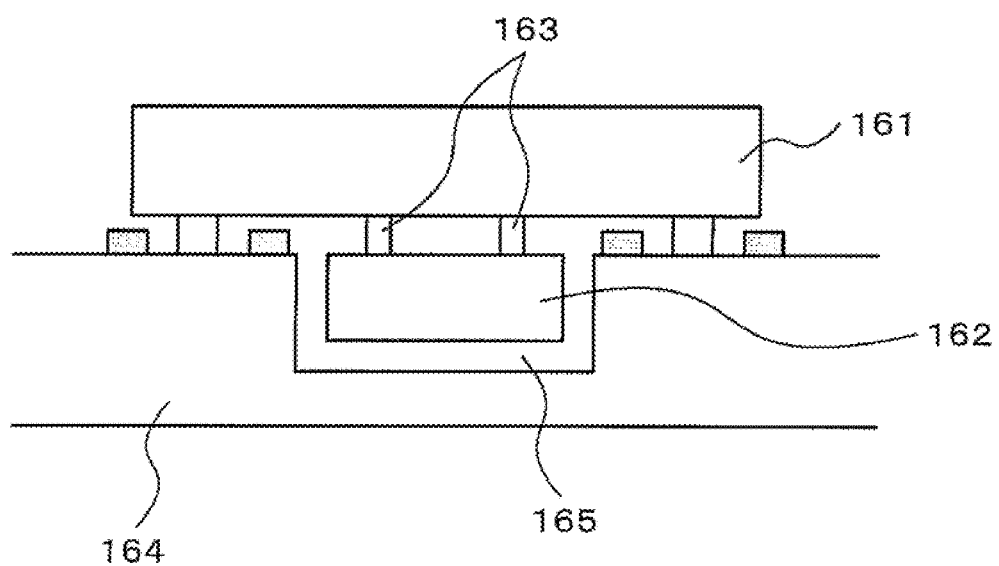
FIG. 16 is a diagram showing an integrated circuit device having some relation with the present invention.

In the first and second embodiments, although the thermal grease 8 is being used in order to improve heat radiation characteristics, the construction may be such that, as shown in FIG. 14, the LSI chip 3 contacts the inner layer conductor 7 directly without using the thermal grease 8.

Also, in the first and second embodiments, although the thermal grease 8 is used as a heat conduction material intervening between the LSI chip 3 and the package substrate 2, solder may be used in place of the thermal grease 8. When solder has a thermal conductivity higher than that of thermal grease, heat radiation characteristics can be improved more. Further, in the present invention, although thermal grease and solder has been illustrated, the heat conduction material is not limited to those. It may he anything with a high thermal conductivity.

Further, in the first and second embodiments, a ceramic substrate may be used as the package substrate 2.

Yet further, in the above description of the first and second embodiments, although BGA has been used, LGA (Land Grid Array) may be used instead of BGA.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. A semiconductor device comprising:
 a substrate including a surface an inner layer conductor, the substrate defining a cavity, the cavity comprising a bottom surface on which a part of said inner layer conductor is exposed;
 a first semiconductor element contacting, in said cavity, said inner layer conductor directly or via a heat conductor material;
 a second semiconductor element connected electrically with said substrate and said first semiconductor element, wherein
 said bottom surface of said cavity is located inwards as compared to said surface of said substrate, such that said bottom surface is not flush with said surface,
 and at least a part of said first semiconductor element is located in said cavity.

2. The semiconductor device according to claim 1, wherein said first semiconductor element is mounted in a face-up manner, and said second semiconductor element is mounted in a face-down manner.

3. The semiconductor device according to claim 2, wherein said second semiconductor element is mounted in a flip-chip-mounting manner.

4. The semiconductor device according to claim 3, wherein said first semiconductor element is connected with said second semiconductor element via a bump.

5. The semiconductor device according to claim 1, wherein said heat conduction material is thermal grease or solder.

6. The semiconductor device according to claim 1, further comprising a heat sink attached to said second semiconductor element.

7. The semiconductor device according to claim 1, further comprising:
 a third semiconductor element stacked between said first and second semiconductor elements.

* * * * *